United States Patent [19]
Larduinat et al.

[11] Patent Number: 5,905,266
[45] Date of Patent: May 18, 1999

[54] CHARGED PARTICLE BEAM SYSTEM WITH OPTICAL MICROSCOPE

[75] Inventors: Xavier Larduinat, Sunnyvale; James H. Brown, San Jose; Theodore R. Lundquist, Dublin, all of Calif.

[73] Assignee: Schlumberger Technologies, Inc., San Jose, Calif.

[21] Appl. No.: 08/770,621

[22] Filed: Dec. 19, 1996

[51] Int. Cl.$^6$ ........................... H01J 37/26
[52] U.S. Cl. ............... 250/492.21; 250/492.2; 250/491.1
[58] Field of Search .......... 250/492.21, 492.2, 250/309, 440.11, 442.11, 491.1

[56] References Cited

U.S. PATENT DOCUMENTS 5,124,927  6/1992  Hopewell et al. ............. 250/491.1
5,214,282  5/1993  Yamaguchi et al. ............ 250/492.2
5,333,495  8/1994  Yamaguchi et al. ........... 250/492.21

*Primary Examiner*—Kiet T. Nguyen

[57] ABSTRACT

A charged particle beam system such as a focused ion beam system includes a vacuum chamber; an optical microscope located so as to have a filed of view within a first region of the chamber; a laser aligned with the optical microscope so as to project a laser beam into the first region; a charged particle beam column located within the chamber and arranged so as to focus a charged particle beam into a second region of the chamber; and specimen support located in the chamber and moveable between a first position in the first region and a second position in the second region. The laser is used to mark a DUT with a registration mark which is visible in the images from the optical microscope and the charged particle beam. The position of the registration mark can be accurately determined in the optical image and the position of features which would otherwise be invisible in the charged particle beam image inferred.

22 Claims, 4 Drawing Sheets

5,905,266

CHARGED PARTICLE BEAM SYSTEM WITH OPTICAL MICROSCOPE

FIELD OF THE INVENTION

The present invention relates to a charged particle beam device such as a focused ion beam (FIB) system of a type generally used for milling integrated circuit (IC) devices, and in particular to such a system having an optical microscope located within the system vacuum chamber.

BACKGROUND OF THE INVENTION

Charged particle beam systems, e.g. scanning electron microscopes (SEMs), electron beam probers and focused ion beam (FIB) systems, are used in a variety of ways to aid in the diagnosis and repair of IC devices. For example, FIB systems are used to mill away material overlying a conductor so as to expose the conductor for modification such as severing or connection with other conductors, or repair. When a conductor of interest is hidden by overlying layers, it is necessary to provide some manner in which it can be located to allow accurate positioning for milling. There have been various previous proposals for dealing with this problem.

Traditionally, structures within IC devices (dies) have been accessible by charged particle beam devices from the front surface of the device. However, when the region of interest lies below a power plane, the structures cannot be seen by any method and even when the power plane is removed, there are no topological features which can be seen in a FIB or e-beam image. While it is possible to see through the substrate, silicon being transparent at infra red wavelengths, or when the power plane is removed, it is extremely difficult to engineer a system in which an optical system can have the same field of view as a FIB system. It is also difficult and expensive to produce a moveable stage to allow visual imaging to be used to locate a FIB site on a die at one location which is then moved to another for FIB processing.

U.S. Pat. No. 4,683,378 describes four different approaches for controlling a FIB milling operation in which structures of interest are hidden by overlying layers. The first approach is to compare scanning ion microscope image with CAD data to infer the position of a site of interest. The second approach is to position a reference die under an optical microscope and use the optical image of the reference die to located the corresponding position in the SIM image. The third approach is to move the die between an optical microscope and the SIM and compare the images from both to find the location of interest. The fourth approach is to move the die between optical, electron beam and scanning ion microscopes to provide images with different objects visible or different resolutions. These last three approaches requires the use of a high accuracy stage to move the die between the microscopes for registration of the images. Other proposals for using optical images in FIB processing generally fall into one or other of these approaches.

It has also been proposed to attempt to overcome the problem by using a FIB to place a mark on a die, moving the die to an optical microscope and locating the mark so as to determine its position in relation to the structures in the die, and then moving the die back to the FIB and using the mark and the optical information to navigate during a FIB milling operation. This approach has the problems that FIB marking takes a relatively long time, three steps are required and two movements of the die are needed to move between the optical and FIB locations.

It is an object of the present invention to provide a system which allows optical techniques to be combined with charged particle techniques for processing dies without the problems identified above.

SUMMARY OF THE INVENTION

The present invention provides a charged particle beam system, comprising a vacuum chamber; an optical microscope having a field of view in a first region of the chamber; a laser aligned with the optical microscope so as to project a laser beam into the first region; a charged particle beam column located within the chamber and arranged so as to focus a charged particle beam into a second region of the chamber; and specimen support means located in the chamber and moveable between a first position in the first region and a second position in the second region.

The present invention also provides a method of processing a specimen in a charged particle ion beam system, comprising placing the specimen at a first position in a vacuum chamber; obtaining an optical image of the specimen at the first position; placing a mark on the specimen which is visible in the optical image; moving the specimen to a second position in the chamber; scanning a charged particle beam over the specimen, detecting particles produced thereby (secondary charged particles, scattered primary particles, photons etc.) so as to obtain a contrast image which includes the mark; and using the optical image and contrast image to control operation of a charged particle beam to process the specimen.

The invention is characterized in that the optical microscope, laser and beam column all operate inside the vacuum chamber. It is not necessary that the optical microscope or laser be located within the chamber, although this may be done if needed, only that the field of view of the microscope and the projection of the laser beam be into the vacuum chamber. Thus it is possible to use the image from the microscope to control the operation of the column. Also the use of a laser to provide a mark on the surface which is visible in both the optical and contrast images allows such control with a degree of accuracy not previously available and without the need for a very high accuracy stage.

The charged particle beam device can be a SEM, e-beam prober or FIB device, the latter being preferred (the term "FIB" will be used throughout this document but it will be appreciated that the application of the invention is not so limited and these other devices can be used should circumstances permit). The optical microscope, which could comprise a laser scanning microscope if required, preferably has a resolution as high as possible, of the order of 0.25 $\mu$m with the maximum magnification possible, typically in the 200X–4000X range. Any suitable device can be used to transmit the image to a workstation for use in navigating the FIB device to the correct location on the die. While a CCD device is preferred, other devices such as vidicon tubes, photomultipliers etc. might also be used. The laser should typically operate in the visible, IR or UV part of the spectrum, for example a green/UV laser. In a particularly preferred arrangement, the laser is arranged to project its beam along the optical axis of the microscope.

In use the present invention operates as follows:

1) A specimen is placed in the vacuum chamber in the field of view of the optical microscope. Features of interest in the specimen will be visible and the microscope can be positioned by means of an X-Y-Z stage to show these features in the optical image.
2) The laser which, is aligned with the microscope, is then used to make a registration mark on the surface of the specimen in the region of the features of interest and an optical image including the mark is stored. The exact location of the FIB processing site, the region in which FIB milling is to take place, (the "FIB box") is identified relative to the laser registration mark.

3) The specimen is then moved to the FIB column position on a moveable stage, with an accuracy of the order of ±10 µm and the laser mark is located in the FIB contrast image by moving the column on an X-Y stage. The FIB box is positioned on the die using the location of the box relative to the registration mark obtained from the optical image 4) The FIB operation is conducted using the optical data until such time as features can be seen in the FIB image.

When a power plane is present, step 1) is preceded by positioning a coarse window in the power plane and milling the power plane away with a FIB device before using the optical microscope to mark or obtain an image.

DESCRIPTION OF THE PREFERRED EMBODIMENT

Figure 1:
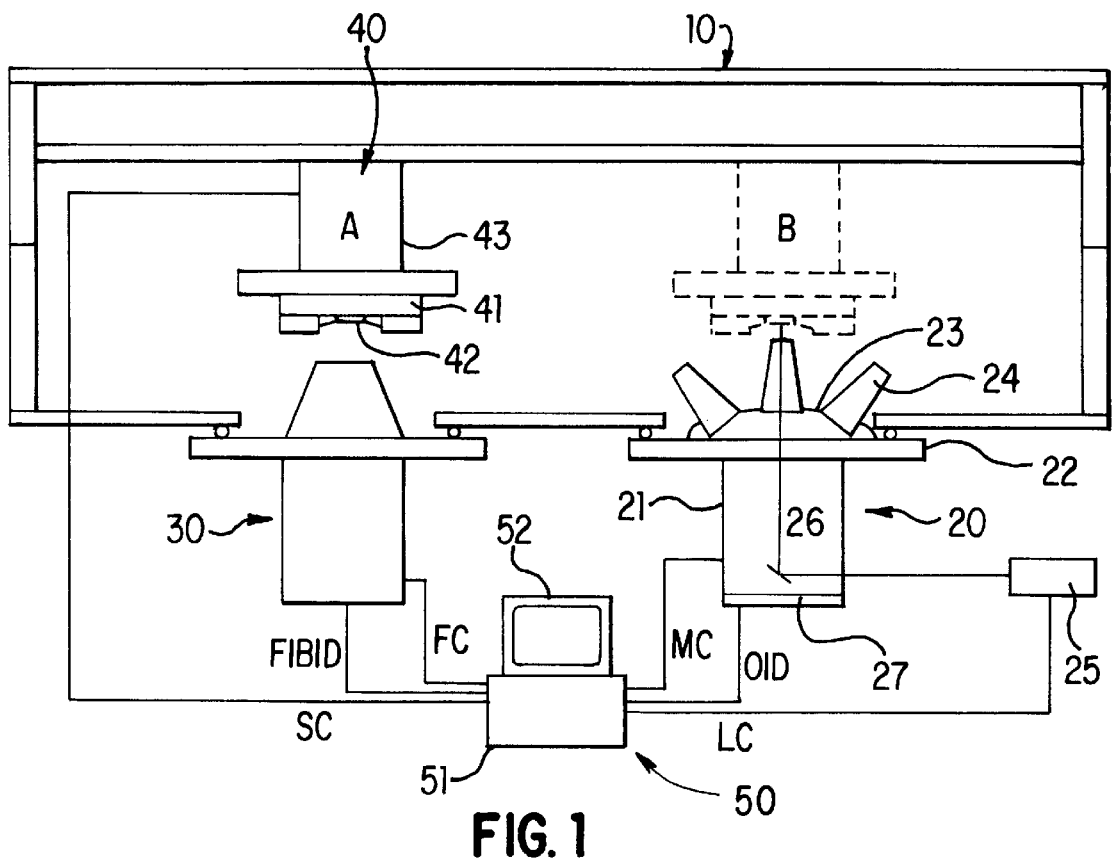
FIG. 1 shows a schematic view of a system according to one embodiment of the invention.

Referring now to FIG. 1, the system shown therein comprises broadly a vacuum chamber 10 having an optical column 20 at a first location, a FIB column 30 at a second location, and a shuttle 40 which is moveable between the optical column 20 and the FIB column 30. A control system 50 is provided to operate the columns 20, 30 and shuttle 40. The optical column and FIB column are mounted for X, Y movement. This can be done by way of a single X, Y mounting for both, or individual X, Y mountings which are synchronized together.

The optical column 20 comprises and optical microscope 21 mounted on a Z stage 22 and including a turret 23 holding various magnification objective lenses 24. A laser 25 projects a beam 26 into the microscope 21 and along its optical axis to the objective lens 24. A CCD device 27 is placed at the top of the microscope 21. The microscope 21 is of a type available today and comprise an optical, visible light microscope with a long working distance (~10 mm at 200×magnification), vacuum-compatible lenses (Mitutoyo) from companies such as TIC or Zeiss. An appropriate microscope will have an objective lens which gives the highest magnification possible at resolution of about 0.25 µm and having fields of view in the range 500 µm×500 µm for low magnification to 50 µm×50 µm at maximum magnification. An alternative arrangement (not shown) is to have the microscope located outside the chamber and viewing a filed of view inside the chamber through a window in the chamber wall. This arrangment can have advantages in not requiring vacuum compatible lenses and avoiding contamination of the lens by material ejected during the FIB processing.

The microscope is adapted to allow a laser to project a beam along the axis of the microscope. Such modifications are available from companies such as New Wave Research of Sunnyvale, Calif. under the designation QuikLaze. Such a system has a green/UV laser operating at 532 nm providing 6 ns pulses of 0.6 µmJ energy. The CCD device 27 provides a digital image output, typically as a TIFF image.

The FIB column 30 is of a conventional type used for FIB processing of semiconductor devices. A particularly preferred example is a LMIS gallium ion source with a two-lens focusing column giving a probe diameter of 10 nm to 1000 nm, a beam energy of 5 keV to 30 keV and a beam current of 2 pA–12 nA. Such a column is found in the Schlumberger IDS P2X system available from Schlumberger Technologies, Inc. of San Jose, Calif.

The shuttle 40 includes a typical packaged part mount 41 such as is used in FIB or e-beam systems for mounting an IC DUT 42. The mount 41 is itself mounted on a transfer shuttle 43 which allows the mount 41 to be positioned either above the FIB column 30 (position A as shown), or above the optical column 20 (position B). In view of the benefit offered by the invention, it is not necessary for the shuttle to be positionable with an accuracy of greater than ±10 µm. Such shuttles are readily constructed using conventional techniques.

The control system 50 comprises a workstation 51 including a suitable display 52. CAD data for the DUT 42 are stored in the control system (either in the same workstation or in another computer which is accessed by the control system) which provides control signals (MC, LC, FC, SC) for operation of the microscope 21, laser 25, FIB column 30, and shuttle 40. The control system also receives optical image data (OID) from the optical column 20 and FIB image data (FIBID) from the FIB column 30. The images can be displayed on the display 52 as required for operation of the system.

Figure 2:
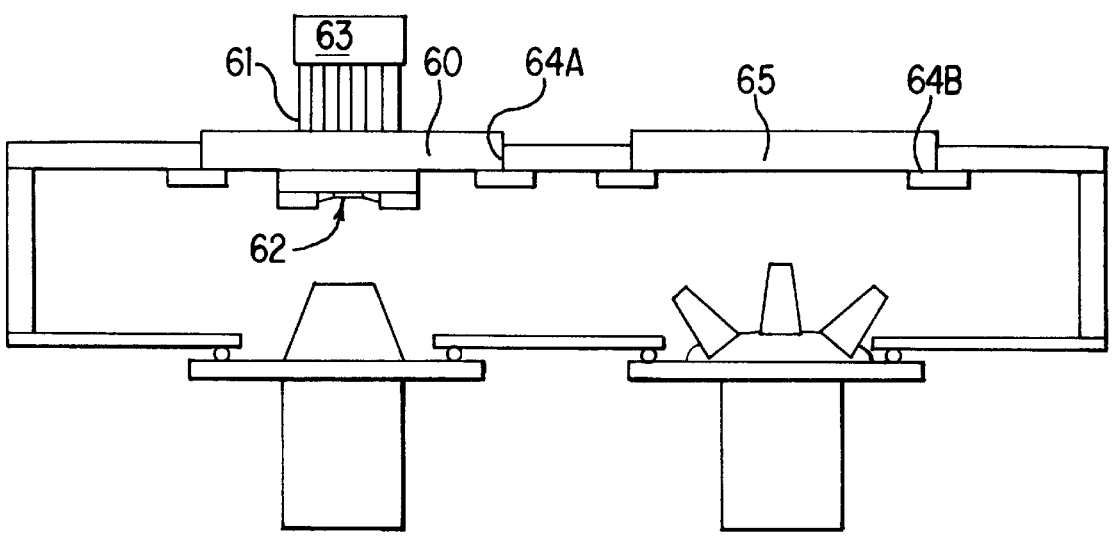
FIG. 2 shows a schematic view of a system according to a second embodiment of the invention.
Figure 3:
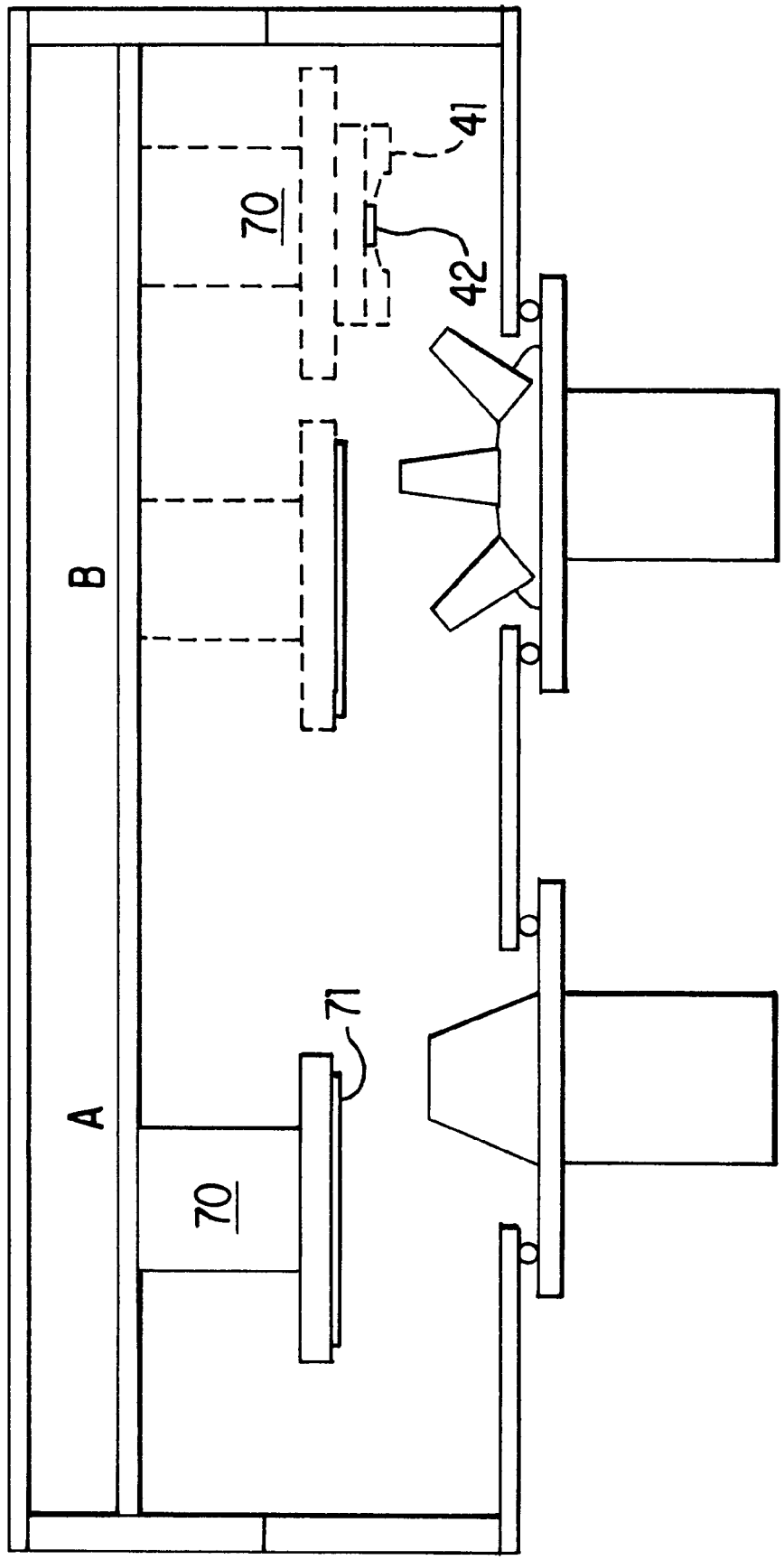
FIG. 3 shows a schematic view of a system according to a third embodiment of the invention.

FIGS. 2 and 3 show variations of the system described above with common parts and/or numbers omitted for clarity. In FIG. 2, the shuttle 40 is replaced by a load module 60 which is provided with connections 61 between the DUT 62 and a tester 63. This arrangement allows the DUT to be exercised while in the vacuum chamber 10 for e-beam, FIB or optical probing or any other suitable probing technique. The locating apertures 64A and 64B are provided above the FIB column 30 and optical column 20 respectively, the load module 60 being positioned in one or other of these and a blanking plate 65 being located in the aperture not occupied by the module 60. The load module in this case being located in the kinematic mounting found in the Schlumberger P2X system.

In FIG. 3, the shuttle 40 is replaced with a wafer stage 70 capable of supporting an 8" wafer 71 used for the manufacture of IC devices. The wafer stage 70 is not only capable of being moved between the A and B positions in the chamber, but also includes X, Y, Z and θ movement to allow the portion of the wafer of interest to be brought into the field of view of either column. One further adaptation of this approach has a mount 41 locatable on the wafer stage 70 so as to allow processing of either packaged parts or wafers in the same system according to requirements.

Figure 4A:
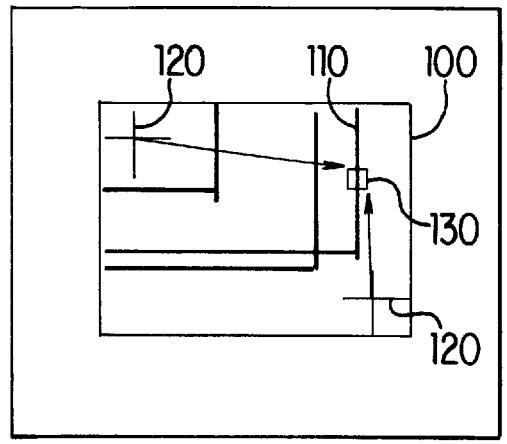
FIGS. 4(a)–4(c) show images obtained during performance of the method according to the invention.

A method according to the invention will now be described with reference to the system shown in FIG. 1 and the images of FIGS. 4(a)–4(c).

1) The DUT 42 is loaded onto the mount 41 on the transfer shuttle 40 in the chamber 10. The chamber is pumped down to a vacuum of $\sim 5 \times 10^{-6}$ Torr. The DUT 42 is positioned above the optical column 20 at position B.

2) The region of interest 100 is located in the optical image from the microscope 21 as seen at the workstation display 52 and the magnification increased until the features of interest 110 can be seen in the optical image. CAD data and/or images can be used to identify these features in the optical image (FIG. 4(a)).

3) The laser 25 is operated to cut registration marks 120 in the surface of the DUT 42 in the field of view of the optical microscope 21. The laser marks are typically a+ with line widths of the order of 0.2 $\mu$m and can be seen in the optical image. The position of the FIB box 130 (the area in which FIB processing is to take place) is determined on the image and its position relative to the registration marks noted. Also, any discrepancy between the CAD data and the image can be resolved at this time.

4) The optical image including the registration marks is stored in the workstation 51.

5) The transfer shuttle is operated to move to position A in the field of view of the FIB column 30.

Figure 4B:
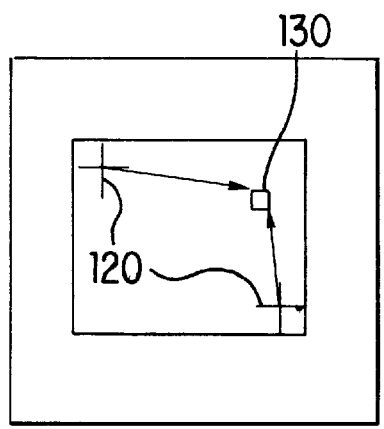
Figure 4C:
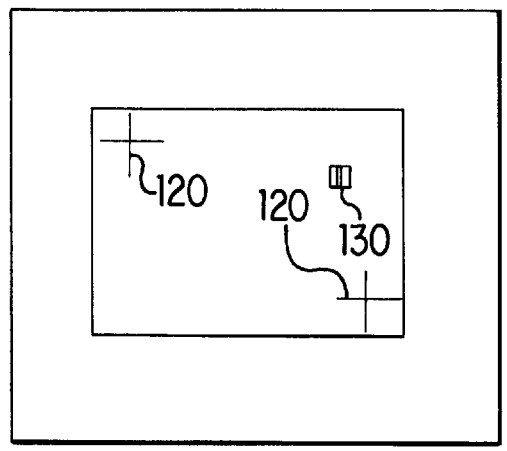

6) A coarse FIB image is taken of the surface of the DUT 42 to locate the registration marks and the X, Y stage operated to bring these within the high resolution field of view (FIG. 4(b)).

7) The optical image is overlaid on the FIB image (with scaling as necessary) and the laser marks in both images are brought into registration. FIB milling is commenced at the location of the FIB box derived from the optical image obtained in step 3) (FIG. 4(c)).

Operation of the system shown in FIG. 2 is essentially the same. However, because there is no moveable stage. After the optical image is obtained, the chamber is brought up to atmospheric pressure and the position of the load module changed after which the chamber is again pumped down to vacuum.

Operation of the system of FIG. 3 is essentially the same as that for the system of FIG. 1, with appropriate modification for navigation on a wafer rather than a die.

For devices in which the structures to be modified lie below a power plane, prior to positioning the device below the optical column, the stage is positioned below the FIB column which is operated to remove the power plane over the general region of interest. This general location is identified from CAD data at relatively low resolution. The procedure can then be performed as described above. For devices with a polyimide layer disposed above the region of interest, the stage is positioned below the optical column and the laser used to remove the polyimide material after which the procedures described above can take place. In such a case, the wavelength of the laser is selected according to the materials to be milled. Also, chemicals can be applied to the device to enhance or retard the laser milling effect or deposition of material as required.

Figure 5:
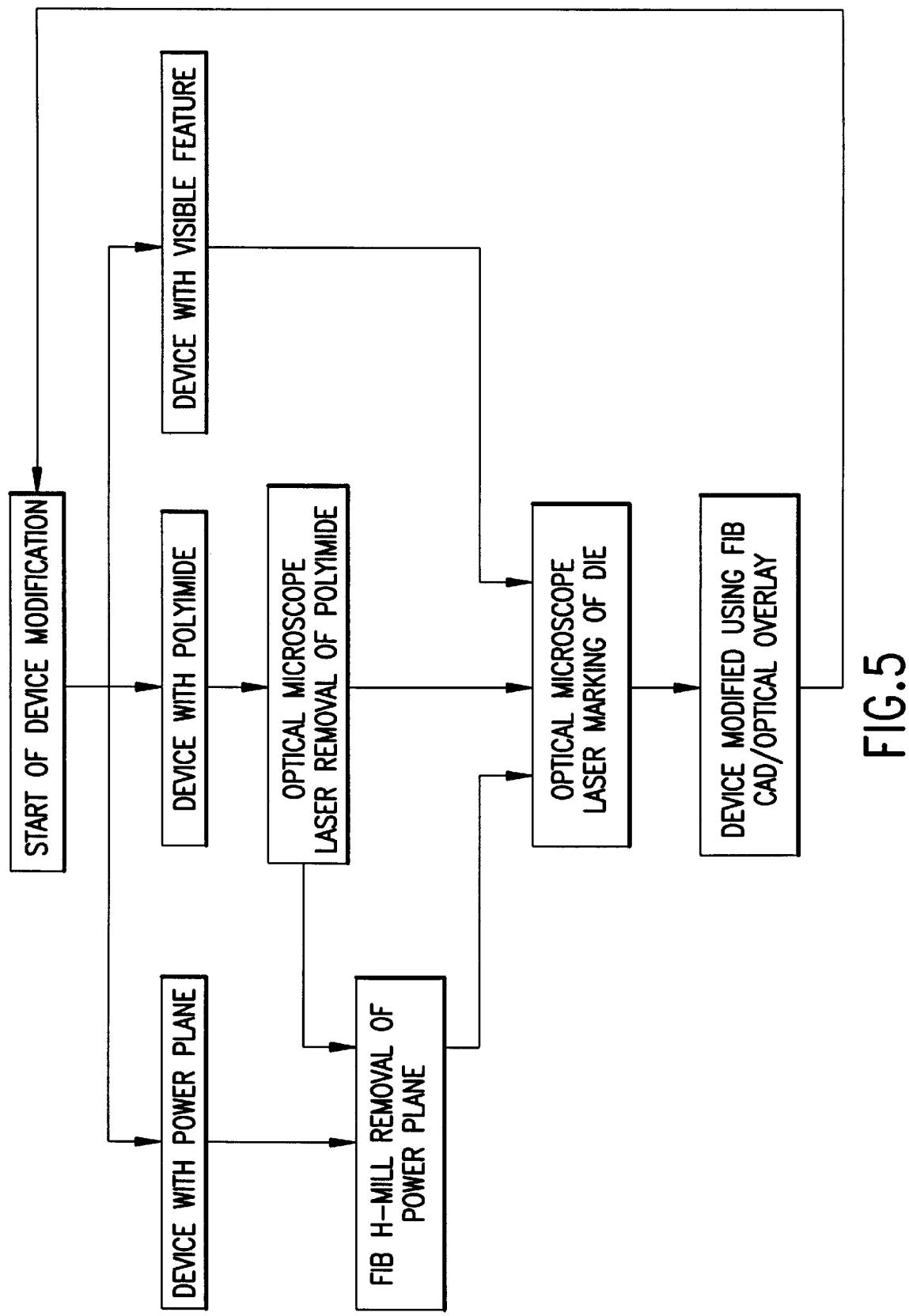
FIG. 5 shows a flow chart identifying the major steps involved in the performance of the methods according to the invention.

The steps described above can be repeated at more than one location on a die and with use of whichever options are required. These options are summarized in the flow chart of FIG. 5.

The present invention displays a number of advantages. The use of local registration marks avoids problems with position errors arising from the mechanical stage, thermal drift, injector induced field offsets in the FIB image, beam aperture change offsets, package induced electric fields, mechanical deformation of the die or wafer and layer to layer misregistration within the die relative to the CAD data. Collectively such errors can be relatively large at the resolution of FIB imaging and processing and, can often be non-linear. Compensation for these errors would otherwise be very difficult and unreliable. The present invention's use of registration marks which can be seen in both optical and FIB images for which the position can be accurately determined at the resolution of interest avoids these problems.

The use of the two images to direct FIB processing requires scaling and calibration to allow local correction of CAD data in the region of the specimen. Repeating this process with a number of images taken from different locations on the specimen allows global correction of the CAD data to correspond to the actual physical configuration of the specimen.

We claim:

1. A charged particle beam system, comprising:
   (a) a vacuum chamber;
   (b) an optical microscope with a field of view in a first region of the chamber and means for obtaining an optical image from the first region;
   (c) a laser aligned with the optical microscope so as to project a laser beam into the first region;
   (d) a charged particle beam column located so as to project a charged particle beam into the chamber and arranged so as to focus the beam into a second region of the chamber; and
   (e) specimen support means located in the chamber and moveable between a first position in the first region and a second position in the second region such that when a specimen is located on the support means in the first position, the laser is arranged to mark the specimen so as to provide a mark which is visible in the optical image.

2. A system as claimed in claim 1, further comprising means for using the optical image to direct operation of the charged particle beam.

3. A system as claimed in claim 2, further comprising means for detecting secondary charged particles from the specimen in the second position and constructing a contrast image therefrom, wherein the laser is arranged to mark a specimen located at the first position so as to provide a mark which is visible in the optical image and in the contrast image.

4. A system as claimed in claim 3, further comprising means for superposing the optical image over the contrast image such that the position of the mark in each image coincides, and means for controlling the ion beam so as to create features only visible in the optical image.

5. A system as claimed in claim 3, wherein the specimen support means is moveable between the first and second positions with an accuracy of about ±10 $\mu$m.

6. A system in claim 1, further comprising means for detecting particles ejected from the specimen on irradiation with the charged particle beam in the second position and constructing a contrast image therefrom.

7. A system as claimed in claim 6, wherein the laser is arranged to mark the specimen located at the first position so as to provide a mark which is visible in the contrast image obtained with the specimen in the second position.

8. A focused ion beam system, comprising:
   (a) a vacuum chamber;
   (b) means for obtaining an optical image in a first region of the chamber;
   (c) an ion beam column arranged so as to focus an ion beam into a second region of the chamber;
   (d) specimen support means located in the chamber and moveable between a first position in the first region and a second position in the second region;

(e) means for detecting secondary charged particles from a specimen on the support means in the second position and constructing a contrast image therefrom;

(f) means for placing a mark on the specimen which is visible in both the optical and contrast images;

(g) means for superposing the optical image on the contrast image so as to identify positions of features of the specimen not visible in the contrast image; and (h) means for controlling the ion beam according to the position of features visible only in the optical image.

9. A system as claimed in claim 8, wherein the means for superposing the images causes the position of the mark in each image to coincide so as to allow the position of features not visible in the contrast image to be determined from the optical image.

10. A system as claimed in claim 8, wherein the means for controlling the ion beam defines a region in the contrast image from which material is to be milled according to information available from the optical image.

11. A method of processing a specimen in a focused ion beam system, comprising:

(a) placing the specimen at a first position in a vacuum chamber;

(b) obtaining an optical image of the specimen at the first position;

(c) placing a mark on the specimen which is visible in the optical image using a laser;

(d) moving the specimen to a second position in the chamber;

(e) scanning a charged particle beam over the specimen and detecting particles produced thereby to obtain a contrast image which includes the mark; and (f) using the optical image and contrast image to control operation of a focused ion beam to process the specimen.

12. A method as claimed in claim 11, wherein the step of scanning a charged particle beam over the specimen comprises scanning the focused ion beam over the specimen to obtain the contrast image.

13. A method as claimed in claim 11, comprising forming a combined image by superposing the optical image onto the contrast image, and using the combined image to control processing of the specimen.

14. A method as claimed in claim 13, further comprising scaling the optical image to align with the contrast image.

15. A method as claimed in claim 13, wherein the step of superposing the optical image and the contrast image is performed so that the positions of the marks in the images coincide.

16. A method as claimed in claim 15, wherein the optical image contains features not visible in the contrast image, the position of the features relative to the mark being used to control processing of the specimen.

17. A method as claimed in claim 16, wherein the step of processing the specimen comprises defining a region in the contrast image according to the position of features visible only in the optical image, and using the focused ion beam to remove material from the specimen in the defined region.

18. A method as claimed in claim 11, further comprising using design data to control processing of the specimen.

19. A method as claimed in claim 18, wherein the optical image is used to correct the design data to reflect the actual configuration of the specimen.

20. A method as claimed in claim 19, wherein optical images of different parts of the specimen are used to correct the design data for the specimen.

21. A method as claimed in claim 11, wherein further contrast images are obtained during processing which are used to control processing of the specimen with the focused ion beam.

22. A method as claimed in claim 11, further comprising using the charged particle beam to probe structures in the specimen.

* * * * *